United States Patent
Lo et al.

[11] Patent Number: 6,124,632
[45] Date of Patent: Sep. 26, 2000

[54] MONOLITHIC SILICON MASS FLOW CONTROL STRUCTURE

[75] Inventors: Lieh-Hsi Lo, Hsin-Chu Hsien; Ming-Jye Tsai, Hsin-Chu; Ruei-Hung Jang, Hsin-Chuang, all of Taiwan

[73] Assignee: Industrial Technology Research Institute, Hsinchu Hsien, Taiwan

[21] Appl. No.: 09/359,423

[22] Filed: Jul. 23, 1999

[51] Int. Cl.[7] .......................... H01L 23/02; H01L 23/10; H01L 23/34
[52] U.S. Cl. .......................... 257/678; 257/723; 257/706; 257/714
[58] Field of Search .................. 257/678, 723, 257/703, 706, 712–714, 728; 361/676, 687, 688, 699, 701, 702, 704

[56] References Cited

U.S. PATENT DOCUMENTS

| | | | |
|---|---|---|---|
| 4,977,443 | 12/1990 | Kobayashi et al. | 257/714 |
| 5,239,443 | 8/1993 | Fahey et al. | 361/689 |
| 5,329,160 | 7/1994 | Miura et al. | 257/710 |
| 5,349,831 | 9/1994 | Daikoku et al. | 257/714 |
| 5,705,850 | 1/1998 | Ashiwake et al. | 257/714 |
| 5,719,444 | 2/1998 | Tilton et al. | 257/714 |
| 5,774,334 | 6/1998 | Kawamura et al. | 361/699 |
| 5,959,351 | 9/1999 | Sasaki et al. | 257/714 |

FOREIGN PATENT DOCUMENTS

| | | | |
|---|---|---|---|
| 63-127557 | 5/1988 | Japan | 257/697 |

*Primary Examiner*—Sheila V. Clark
*Assistant Examiner*—Jhihan B. Clark
*Attorney, Agent, or Firm*—Bacon & Thomas

[57] ABSTRACT

A monolithic silicon mass flow control structure is made by etching process to form a valve structure and a channel in a silicon chip, laser or electric discharge process to form a flow inlet and a flow outlet in a glass chip, and anode connection process to combine the silicon chip and the glass chip. At least a flow sensing element and a micro valve control element are disposed above the channel and the valve structure respectively for flow sensing and control purposes. A semi-complete product is sealed on a base board, wherein an output signal from the flow sensing element is compared with a pre-set value in an externally connected control circuit, which will change heating condition so as to control flow of the valve structure.

12 Claims, 5 Drawing Sheets

MONOLITHIC SILICON MASS FLOW CONTROL STRUCTURE

BACKGROUND OF THE INVENTION

This invention relates to a monolithic silicon mass flow control structure, particularly to a mass flow control structure comprising a flow-sensing module, a thermal buckling valve, and a distributary module all made by micro electromechanical technology, wherein at least one micro flow measurer and a micro valve are integrated and constructed on a single chip for mass flow control.

A conventional flow-measuring module is usually made by forming a flow channel with tubing technology, winding a pair of wire thermistors on outer tube wall, and hand operation spot welding to control difference between thermistors precisely. Therefore, when a fluid is flowing through the channel, the difference in thermistors can be used for calculation of the flow rate.

As most parts of the module must be made by handwork, it is obviously disadvantageous for production, however.

In view of the above, some improvements have been disclosed later on to mainly introduce a silicon nitride suspension thin-film or chip by micro electromechanical technology, wherein thermistors made by thin-film technology are disposed on the thin-film and undergone laser trimming process for precise control of resistance in the thermistors. The flow-measuring chip is then placed in the flow channel to detect change in the thermistors for flow calculation.

To place the flow-measuring chip in a flow channel may have a high sensitivity to temperature of the fluid, however, it is liable to be affected by the fluid in lifetime, or the flow field may be interfered if it vibrates to incur an incorrect measurement.

SUMMARY OF THE INVENTION

This invention is proposed to provide a monolithic silicon mass flow control structure comprising a flow-sensing module, a thermal buckling valve, and a distributary module.

Another object of this invention is to integrate and fabricate at least a micro flow measurer and a micro valve on a single chip which is sealed and packaged on a base board to form a flow control module that is screw-jointed together with a distributary module for easy whole set maintenance or replacement.

A further object of this invention is to provide a distributary module, wherein an output hole can be perforated vertically or obliquely in order to meet requirement of the monolithic silicon mass flow control structure for reducing flow resistance and lowering cost of the ceramic base board.

As to achieve abovesaid objects of this invention, a fabrication process is conducted, wherein a valve structure and a channel are formed in the chip by back-etching process; a glass chip formed with a flow inlet and a low outlet is precisely coincident with the silicon chip for anode connection to combine each other; at least a flow sensing element and a micro valve controller are disposed above the channel and micro valve for purpose of flow-sensing and control of the micro valve; the semi-complete product is then packaged on a base board which is provided with a flow inlet and a flow outlet as well as printed circuit coupled with the flow sensing elements and the valve controller.

BRIEF DESCRIPTION THE DRAWINGS

DETAILED DESCRIPTION OF THE PREFERRED EMBODIMENT

Figure 1:
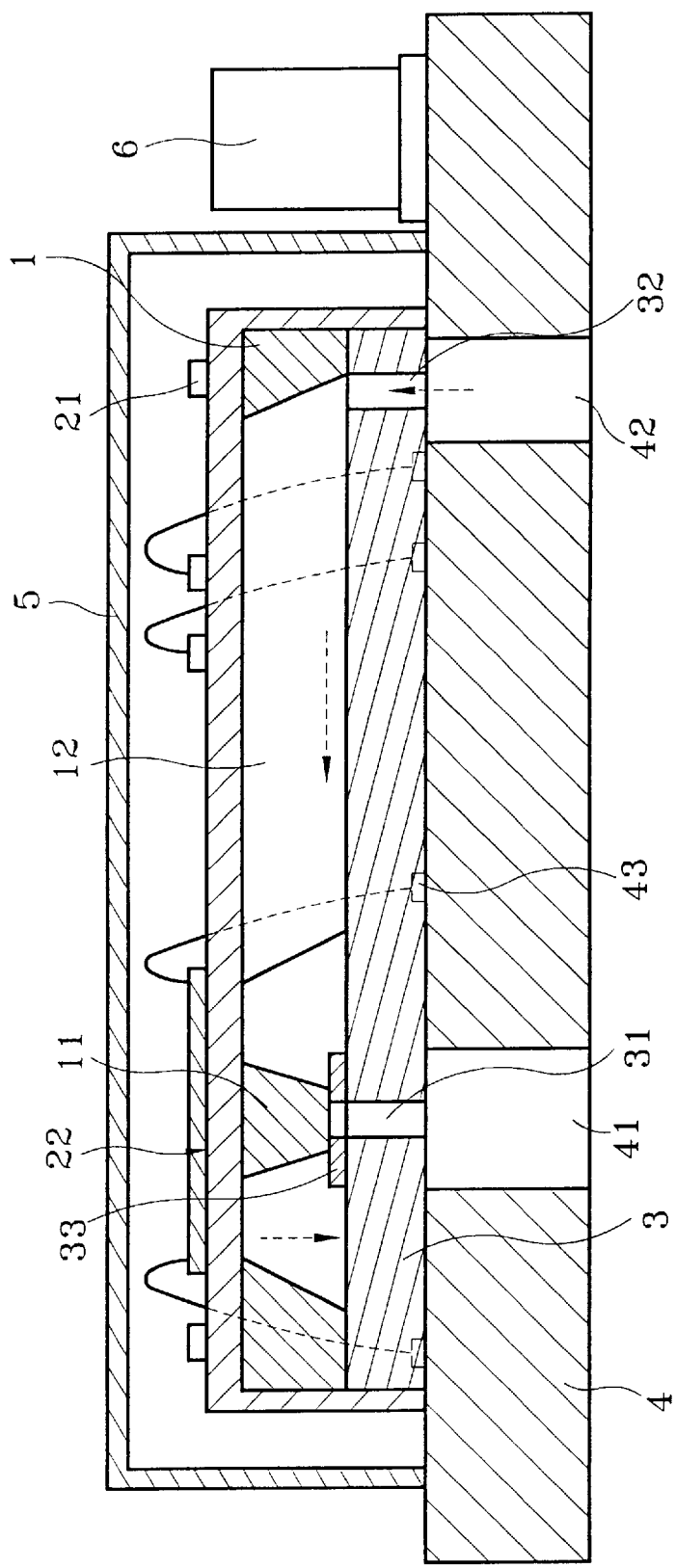
FIG. 1 is a schematic cutaway sectional view of a monolithic silicon mass flow control structure of this invention.

As shown in FIG. 1 a schematic cutaway sectional view of a monolithic silicon mass flow control structure of this invention, the structure comprises a flow-sensing module, a thermal buckling valve, and a distributary module all made by micro electromechanical technology, wherein a micro flow measurer and a micro valve are integrated and fabricated on a monolithic chip.

Abovesaid mass flow control structure is fabricated by back-etching a silicon chip 1 to form a valve structure 11 and a channel 12. The silicon chip 1 is then seated on a substrate 3 of Pyrex glass chip. A flow inlet 32 and a flow outlet 31 are formed in the substrate 3 by laser and electric discharge process, which, the substrate 3, is precisely coincident with the silicon chip 1 for anode connection to have the former and the latter combined accurately. Besides, a washer 33 made from Polyimide is disposed around the flow outlet 31 on the substrate 3 for leakage-proof.

In addition, two flow-sensing elements 21 are also disposed on positions above the silicon chip 1 to form a mass flow sensing segment, wherein the flow-sensing elements 21 can be, but not necessarily be, platinum or Ni—Co resistors. A micro valve controller 22 located above the valve structure 11 can be, but not necessarily be, a platinum resistor, and thereby to form a thermal buckling microvalve.

Moreover, the above semi-complete product including the silicon chip 1 and the substrate 3 is packaged on a base board 4 which can be, but not necessarily be, made in ceramics or materials used for PCB (printed circuit board). The base board 4 is further provided with two through holes 41, 42 at positions corresponding to the flow outlet 31 and inlet 32, and with soldering points 43 for connection with the flow-sensing elements 21 and the micro valve controller 22. Finally, a cover 5, made of stainless steel for example, is used to seal the above components to construct a monolithic silicon mass flow control structure.

Figure 2:
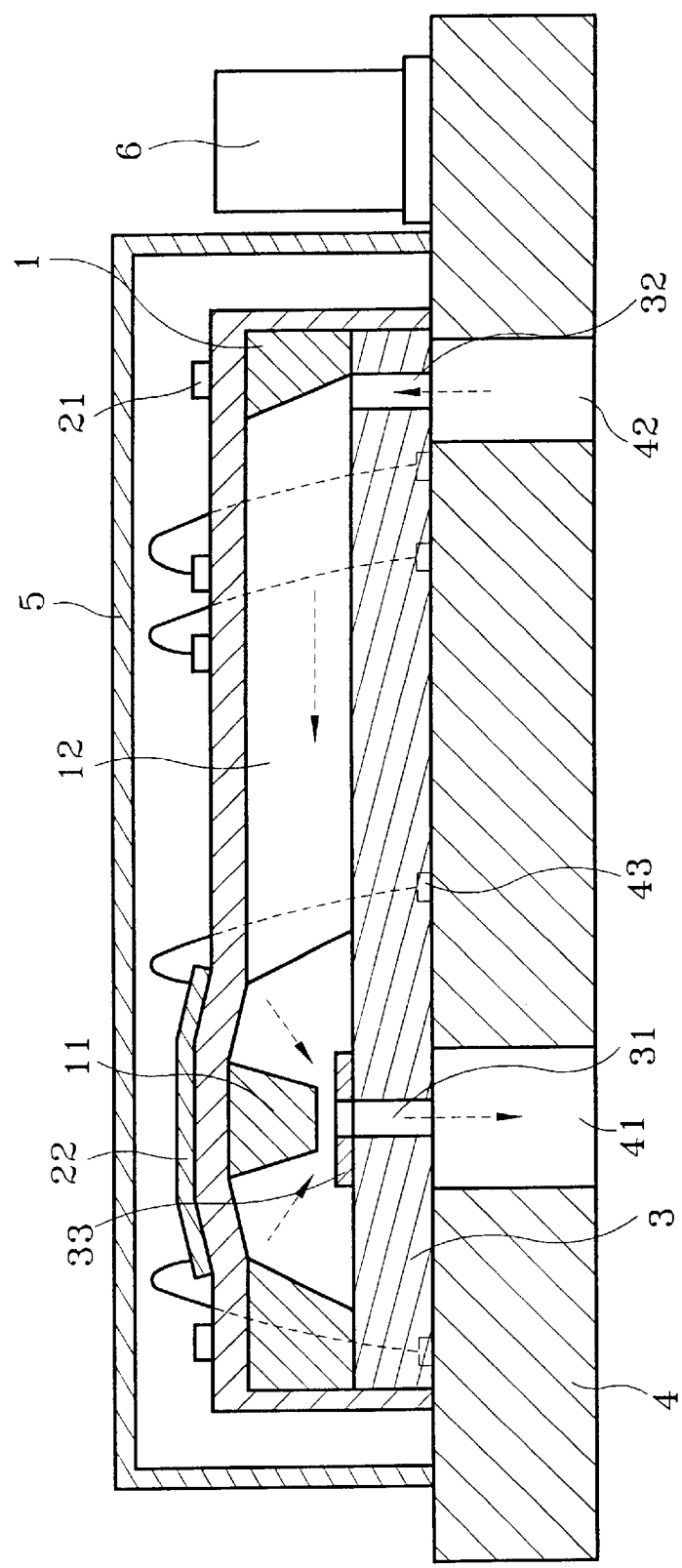
FIG. 2 is a schematic action diagram in cutaway sectional view of the monolithic silicon mass flow control structure of this invention.

As shown in FIGS. 1 and 2 a cutaway sectional view and an action diagram of this invention, a control circuit 6 is arranged on the base board 4 or externally connected for control of the flow-sensing elements 21. Firstly, the flow-sensing elements 21 are pre-set at a proper temperature. When a fluid is flowing through the channel 12, some thermal energy of the flow-sensing elements 21 will be absorbed and carried away by the fluid, the higher the flow speed, the more the thermal energy carried away and the more the power supplied by the control circuit 6 to the flow-sensing elements 21. The output power of the control circuit 6 may serve as a flow index for measuring the flow after calibrated, and the measured power may be taken as a basis for controlling the micro valve controller 22 after comparison is made with a pre-set value. When the control circuit 6 is heating the micro valve controller 22, the valve structure 11 of the silicon chip 1 will produce a thermal buckling effect to make a passage available between the valve structure 11 and the substrate 3, so that the fluid can flow in through the flow inlet 32 and flow out through the flow outlet 31.

Figure 3:
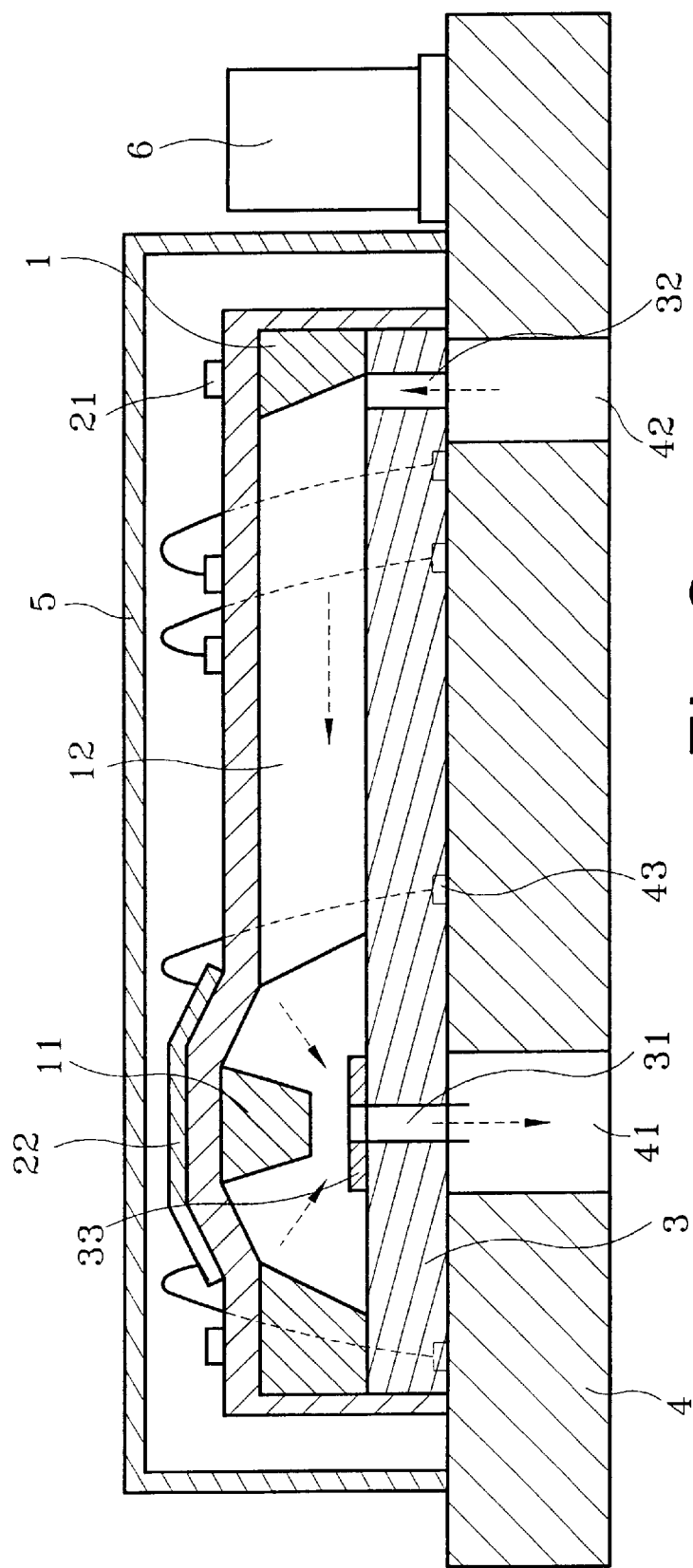
FIG. 3 is another schematic action diagram of FIGS. 1 and 2.
Figure 4:
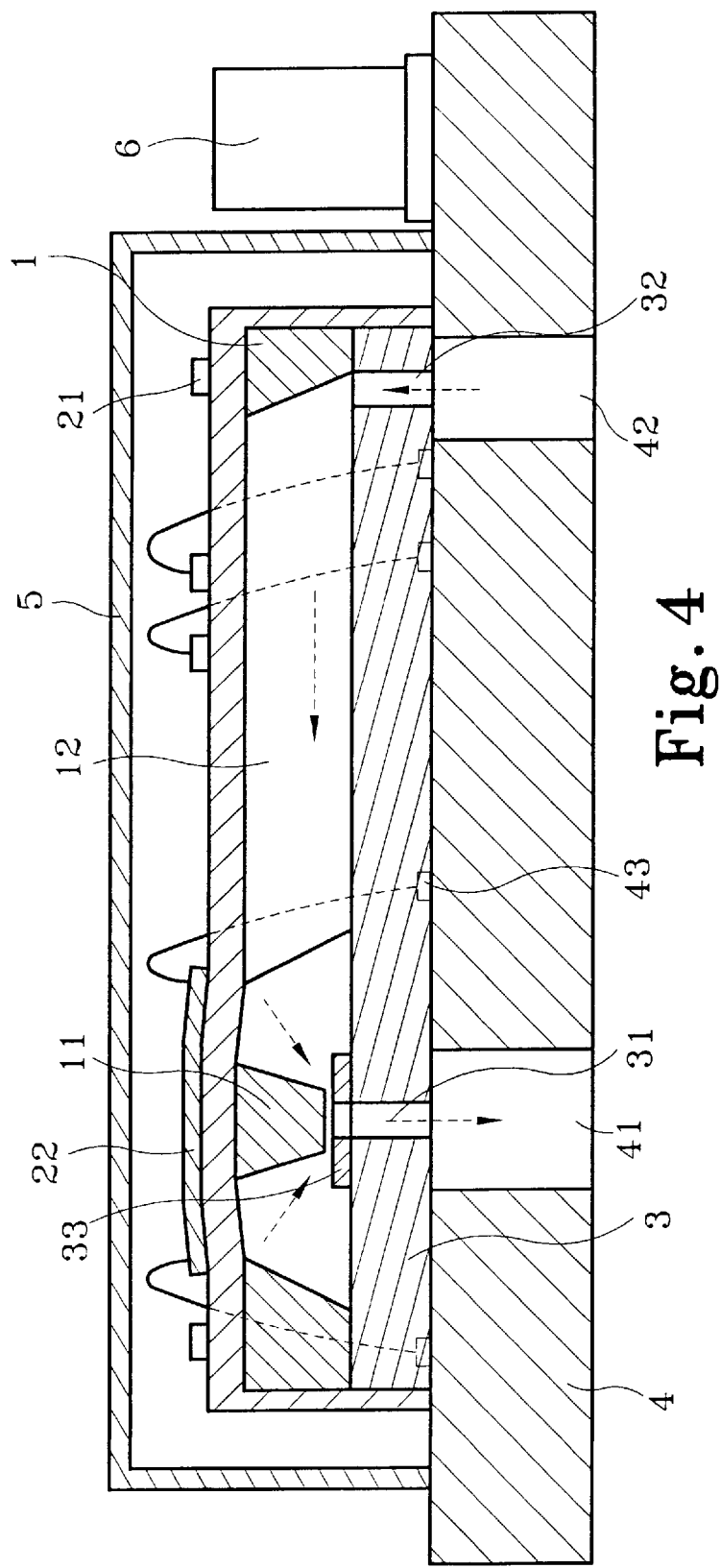
FIG. 4 is a further schematic action diagram of FIGS. 1 and 2.

As shown in FIG. 3, when the power supplied to the flow-sensing elements 21 is smaller than the pre-set value, the control circuit 6 will heat the micro valve controller 22 to a higher temperature to result in a more drastic thermal buckling effect of the valve structure 11 that widens the passage between the valve structure 11 and the base board 4 to permit more fluid to flow in and out.

On the contrary, when the power supplied for sustaining the flow-sensing elements 21 is larger than the pre-set value, the control circuit 6 is supposed to decrease heat quantity to the micro valve controller 22 to narrow the passage as mentioned above.

Figure 5:
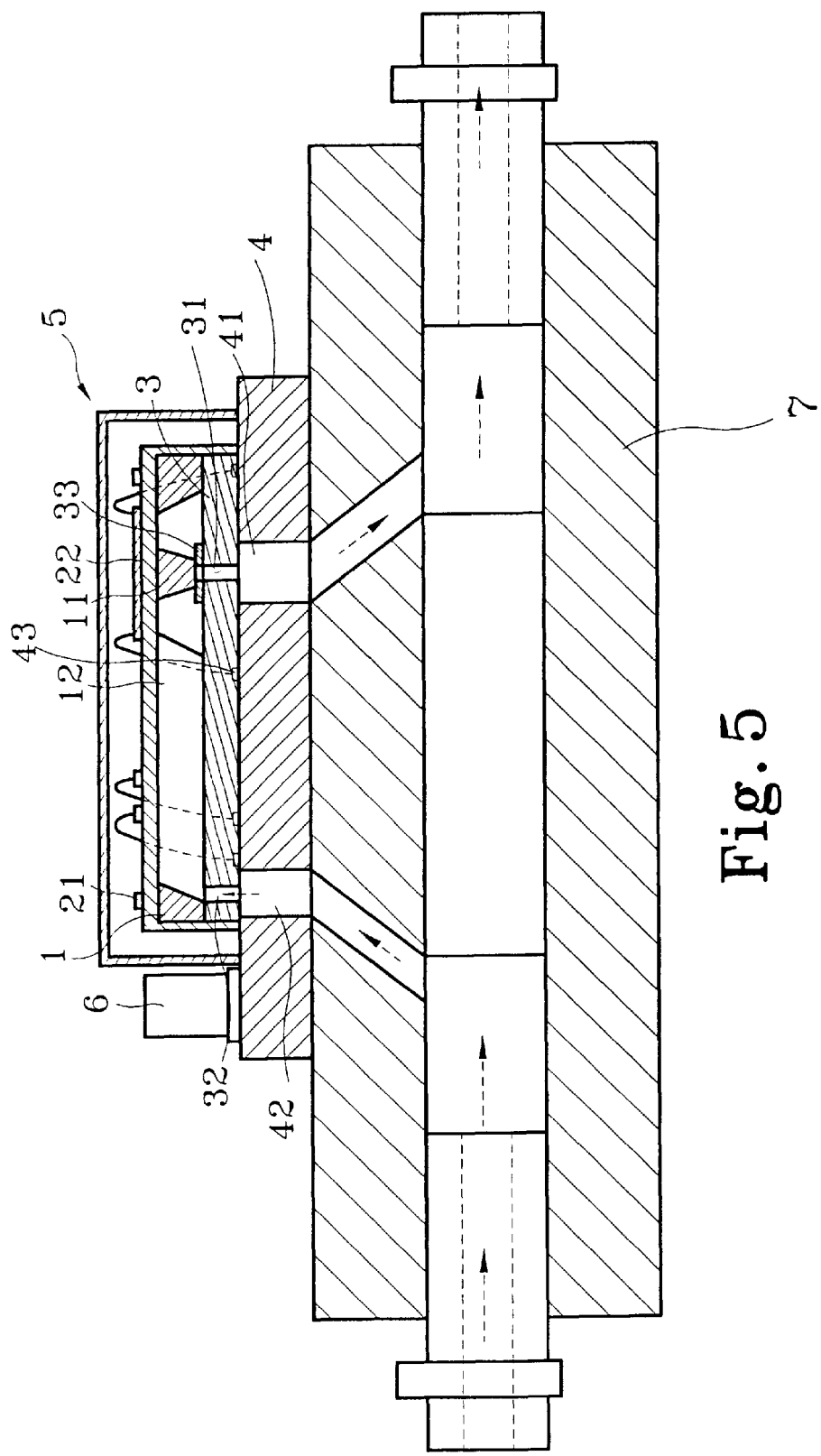
FIG. 5 is schematic view of an embodiment of this invention.

An embodiment of this invention is shown in FIG. 5. The monolithic silicon mass flow control structure of this invention may be applied to a distributary module 7 of a mass flow controller, and by means of calculating power difference between two flow-sensing elements 21 for sustaining the same at a fixed temperature, the micro flow rate of the mass flow controller may be obtained.

The input and output holes of foregoing distributary module 7 may be perforated vertically or obliquely for meeting requirement of the monolithic silicon mass flow control structure in order to reduce flow resistance and lower cost of ceramic base board 4.

Although, this invention has been described in terms of preferred embodiments, it is apparent that numerous variations and modifications may be made without departing from the true spirit and scope thereof, as set forth in the following claims.

What is claimed is:

1. A monolithic silicon mass flow control structure, comprising:
   a circuit printed base board having at least a through hole and a channel;
   a substrate seated on said base board having at least a through hole for connection with a silicon chip to form a channel and a micro valve structure;
   said silicon chip disposed on said substrate being provided with the channel and the micro valve structure;
   at least a flow sensing element and a micro valve control element being disposed at positions corresponding to said channel and micro valve structure; and
   by means of comparing a measured value of said flow sensing element to a pre-set value, a control circuit being capable of controlling heating condition to enable said micro valve control element to conduct flow control.

2. The monolithic silicon mass flow control structure of claim 1, wherein said base board can be made in ceramics or materials used for PCB (printed circuit board).

3. The monolithic silicon mass flow control structure of claim 1, wherein said substrate may be constructed with Pyrex glass chip.

4. The monolithic silicon mass flow control structure of claim 1 or 3, wherein a leakage-proof washer made from Polyimide may be disposed around a flow outlet in said substrate.

5. The monolithic silicon mass flow control structure of claim 1, wherein said flow sensing element can be a platinum or Ni—Co resistor.

6. The monolithic silicon mass flow control structure of claim 1, wherein said micro valve control element can be a platinum resistor.

7. The monolithic silicon mass flow control structure of claim 1, wherein said control circuit can be made on said base board directly.

8. The monolithic silicon mass flow control structure of claim 1, wherein a cover, a stainless steel cover for example, is used to seal a completed mass flow control structure.

9. The monolithic silicon mass flow control structure of claim 1, wherein said mass flow control structure may be applied to a distributary module of a mass flow controller.

10. The monolithic silicon mass flow control structure of claim 1, wherein said micro valve structure and flow sensing element of said mass flow control structure can be made on different chips separately to form an individual micro valve module and flow sensing module for use independently.

11. The monolithic silicon mass flow control structure of claim 5 or 6, wherein value of said resistor can be precisely controlled by laser trimming process.

12. The monolithic silicon mass flow control structure of claim 9, wherein at least an output hole in said distributary module can be perforated vertically or obliquely to meet requirement of said mass flow control structure for reducing flow resistance and lower cost of a ceramic base board.

* * * * *